US005565805A

United States Patent [19]

Nakagawa et al.

[11] Patent Number: 5,565,805

[45] **Date of Patent: *Oct. 15, 1996**

[54] CHANGE-OVER DIVIDER FOR USE IN SATELLITE BROADCAST RECEIVING SYSTEM

[75] Inventors: Yutaka Nakagawa; Tadashi Kajiwara, both of Kanagawa; Keiji Fukuzawa, Chiba; Keiji Yuzawa, Tokyo, all of Japan

[73] Assignee: Sony Corporation, Tokyo, Japan

[ * ] Notice: The term of this patent shall not extend beyond the expiration date of Pat. No. 5,386,587.

[21] Appl. No.: 513,576

[22] Filed: Aug. 10, 1995

Related U.S. Application Data

[60] Continuation of Ser. No. 140,842, Oct. 25, 1993, abandoned, which is a division of Ser. No. 904,557, Jun. 26, 1992, Pat. No. 5,301,352.

[30] Foreign Application Priority Data

Jul. 4, 1991 [JP] Japan .................................... 3-164103

[51] Int. Cl.$^6$ ...................................................... H03K 17/0

[52] U.S. Cl. ............................. 327/99; 455/3.1; 455/3.2; 455/4.2; 455/132; 348/6; 348/10

[58] Field of Search .................................... 328/152, 153, 328/154, 103, 104, 105, 187, 188; 307/241, 242, 243, 244; 358/188, 189, 190, 86; 455/3.2, 3.3, 4.2, 6.1, 6.2, 9, 3.1, 132; 327/403, 407, 99; 370/53, 112

[56] References Cited

U.S. PATENT DOCUMENTS

| | | | |
|---|---|---|---|
| 4,183,054 | 1/1980 | Patisaul et al. | 358/86 |
| 4,345,273 | 8/1982 | Barabas et al. | 348/7 |
| 4,484,218 | 11/1984 | Boland et al. | 358/86 |
| 4,509,918 | 4/1985 | Nagatomi | 358/86 |
| 4,513,315 | 4/1985 | Dekker et al. | 358/86 |
| 4,532,543 | 7/1985 | Greonewegen | 358/86 |
| 4,538,175 | 8/1985 | Balbes et al. | 358/86 |
| 4,677,686 | 6/1987 | Hustig et al. | 358/86 |
| 4,866,787 | 9/1989 | Olesen | 358/86 |
| 4,901,367 | 2/1990 | Nicholson | 358/86 |
| 5,051,816 | 9/1991 | Harrison et al. | 328/187 |
| 5,073,930 | 12/1991 | Green et al. | 358/86 |
| 5,115,514 | 5/1992 | Leslie | 455/9 |
| 5,301,352 | 4/1994 | Nakagawa et al. | 455/3.2 |
| 5,386,226 | 1/1995 | Chanteau | 348/10 |
| 5,386,587 | 1/1995 | Yuzawa | 455/3.2 |

*Primary Examiner*—Timothy P. Callahan
*Assistant Examiner*—Kenneth B. Wells
*Attorney, Agent, or Firm*—Jay H. Maioli

[57] ABSTRACT

A satellite broadcast receiving system is disclosed, in which when each receiver transmits a control-pulse to a change-over divider via a signal cable, the change-over divider selects a desired broadcast signal in response to the control pulse, which is led to its output terminal, then transmitted to each receiver via the signal cable.

2 Claims, 3 Drawing Sheets

CHANGE-OVER DIVIDER FOR USE IN SATELLITE BROADCAST RECEIVING SYSTEM

This is a continuation of application Ser. No. 08/140,842 filed Oct. 25, 1993, now abandoned, which is a divisional of application Ser. No. 08/904,557 filed Jun. 26, 1992, now U.S. Pat. No. 5,301,352.

BACKGROUND OF THE INVENTION

The present invention relates to a satellite broadcast receiving system and a change-over divider for use in this system.

In the near future, satellite broadcast may include Communication Satellite (CS) broadcast using a communication satellite in addition to Broadcast Satellite (BS) broadcast which is actually in execution. Further, CS broadcast may be performed by a plurality of communication satellites. Due to the fact that the height and position of the broadcast satellites and communication satellites are different from each other, a receiver cannot catch all radio waves transmitted therefrom by a single satellite antenna, and thus it should be provided with a plurality of satellite antennas. Additionally, due to overlap of a transmission frequency band of a signal cable for each broadcast, a single signal cable is not sufficient to transmit signals at the same time.

Accordingly, when dividing broadcast signals among a plurality of receivers by using a plurality of common satellite antennas, signal cables corresponding to the number of signals are needed to connect a change-over divider to each receiver, resulting in extremely complicated connection. Further, some people cannot dispose a plurality of signal cables according to their domestic conditions.

It is, therefore, an object of the present invention to provide a satellite broadcast receiving system and a change-over divider for use in this system which contribute to a simplification of the architecture and a reduction in manufacturing cost.

SUMMARY OF THE INVENTION

According to one aspect of the present invention, there is provided a system for receiving broadcast and communication signals, comprising:

- a plurality of antennas disposed to receive the broadcast and communication signals;
- a change-over divider connected to said plurality of antennas and having a plurality of output terminals, said change-over divider separately outputting a predetermined one of the broadcast and communication signals to said plurality of output terminals, respectively; and
- a plurality of receivers connected to said plurality of output terminals of said change-over divider, said plurality of receivers providing control pulse to said change-over divider for selecting one of said plurality of antennas, respectively.

According to another aspect of the present invention, there is provided a change-over divider for selecting signals, comprising:

- a plurality of input terminals;
- a plurality of switches connected to said plurality of input terminals;
- a plurality of input/output terminals connected to outputs of said plurality of switches;

- control pulse detection circuit means connected to said plurality of input/output terminals for detecting a control pulse; and
- a microcomputer connected to said plurality of switches and said control pulse detection circuit means, said microcomputer decoding said control pulse, said microcomputer outputting a change-over control signal to said plurality of switches in response to said control pulse as decoded,
- said plurality of switches selecting a predetermined one of the signals in response to said change-over control signal of said microcomputer.

DETAILED DESCRIPTION OF THE INVENTION

Figure 1:
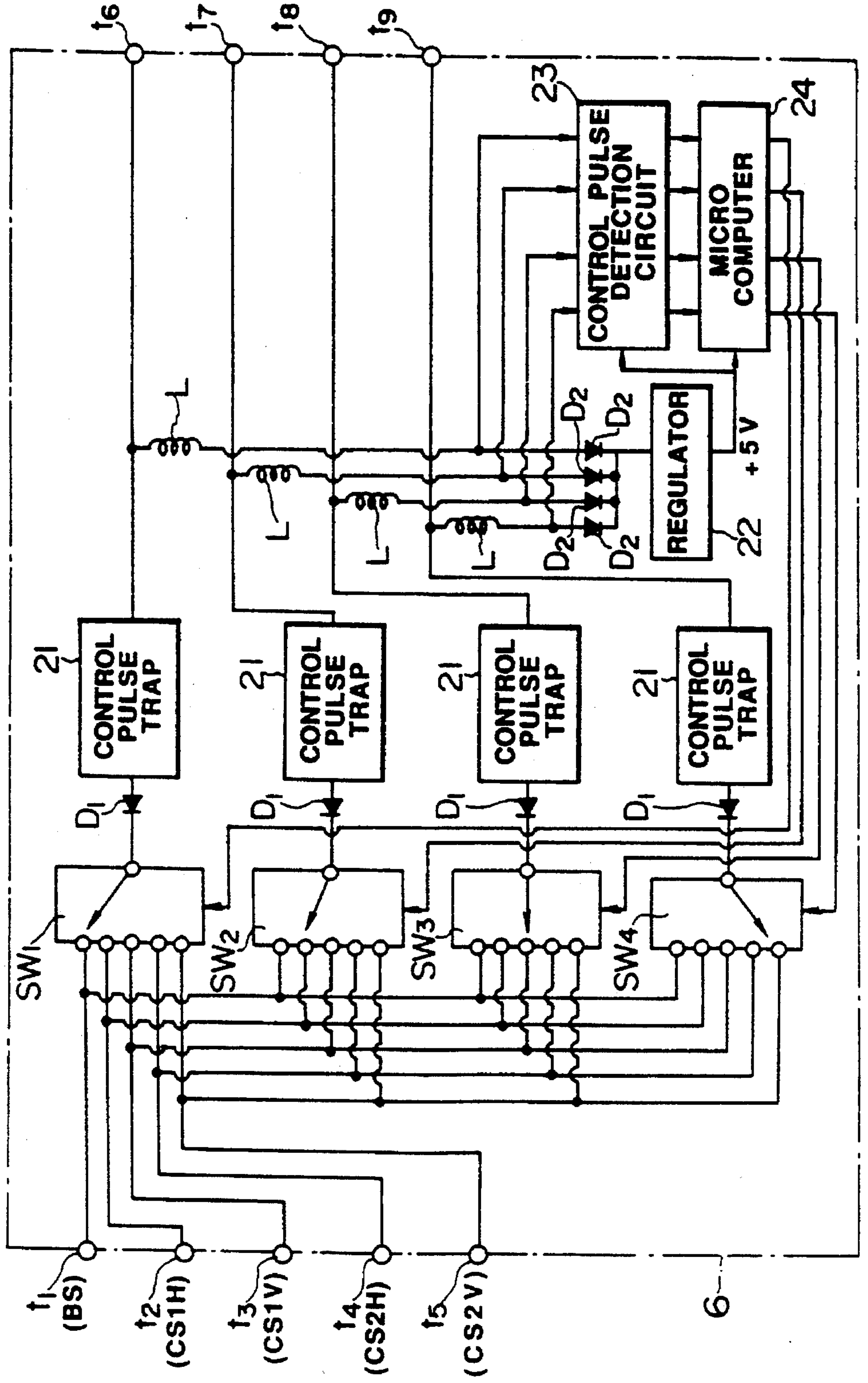
FIG. 1 is a circuit block diagram showing a change-over divider (first preferred embodiment)

Referring to the drawings, wherein like reference numerals designate corresponding parts throughout the views, referring first to FIGS. 1 and 2, a first preferred embodiment of the present invention will be described. FIG. 2 shows a circuit block diagram of a satellite broadcast receiving system. Three antennas are disposed as a satellite antenna: BS antenna 1, $CS_1$ antenna 2, and $CS_2$ antenna 8. The BS antenna 1 serves to collect BS broadcast waves, and the $CS_1$ antenna 2 serves to collect $CS_1$ broadcast waves, and the $CS_2$ antenna 3 serves to collect $CS_2$ broadcast waves.

The BS broadcast wave as collected by the BS antenna 1 is a circularly polarized wave, and it is received in a BS converter 4. A single BS broadcast signal is converted in the BS converter 4 to have a predetermined frequency, then led to a first input terminal $t_1$ of a change-over divider 6 via a signal cable 5.

The $CS_1$ broadcast wave as collected by the $CS_1$ antenna 2 is two linearly polarized waves which meet at right angles, and it is received in a $CS_1$ converter 7. A horizontally polarized broadcast signal and a vertically polarized broadcast signal are converted in the $CS_1$ converter 7 to have a predetermined frequency, respectively, then led to second and third input terminals $t_2$, $t_3$ of the change-over divider 6 via two signal cables 8, 9, respectively.

The $CS_2$ broadcast wave as collected by the $CS_2$ antenna 3 is two linearly polarized waves like the $CS_1$ broadcast wave, and it is received in a $CS_2$ converter 10. A horizontally polarized broadcast signal and a vertically polarized broadcast signal are converted in the $CS_2$ converter 10 to have a predetermined frequency, respectively, then led to fourth and fifth input terminals $t_4$, $t_5$ of the change-over divider 6 via two signal cables 11, 12, respectively.

The change-over divider 6 has four input/output terminals $t_6$–$t_9$, and separately selects respective desired ones of the five input broadcast signals to output it thereto. A detailed architecture thereof is shown in FIG. 1. The input/output terminals $t_6$–$t_9$ are connected to signal cables 13–18 at one ends thereof, respectively. The signal cables 13–18 have the other ends connected to BS/CS receivers 17–20, respectively.

The BS/CS receivers 17–20 are constructed to output converter power supply (DC power voltage) via the signal cables 13–18 when turned on by a power switch. Additionally, the BS/CS receivers 17–20 each have a broadcast selecting switch which permits selection of one of five kinds of broadcast such as BS broadcast, $CS_1$ horizontally polarized wave broadcast, etc. Information selected by the broadcast selecting switch is converted into a control pulse in a pulse code circuit, which is outputted in overlap with converter power supply via a respective one of the signal cables 13–16.

Figure 2:
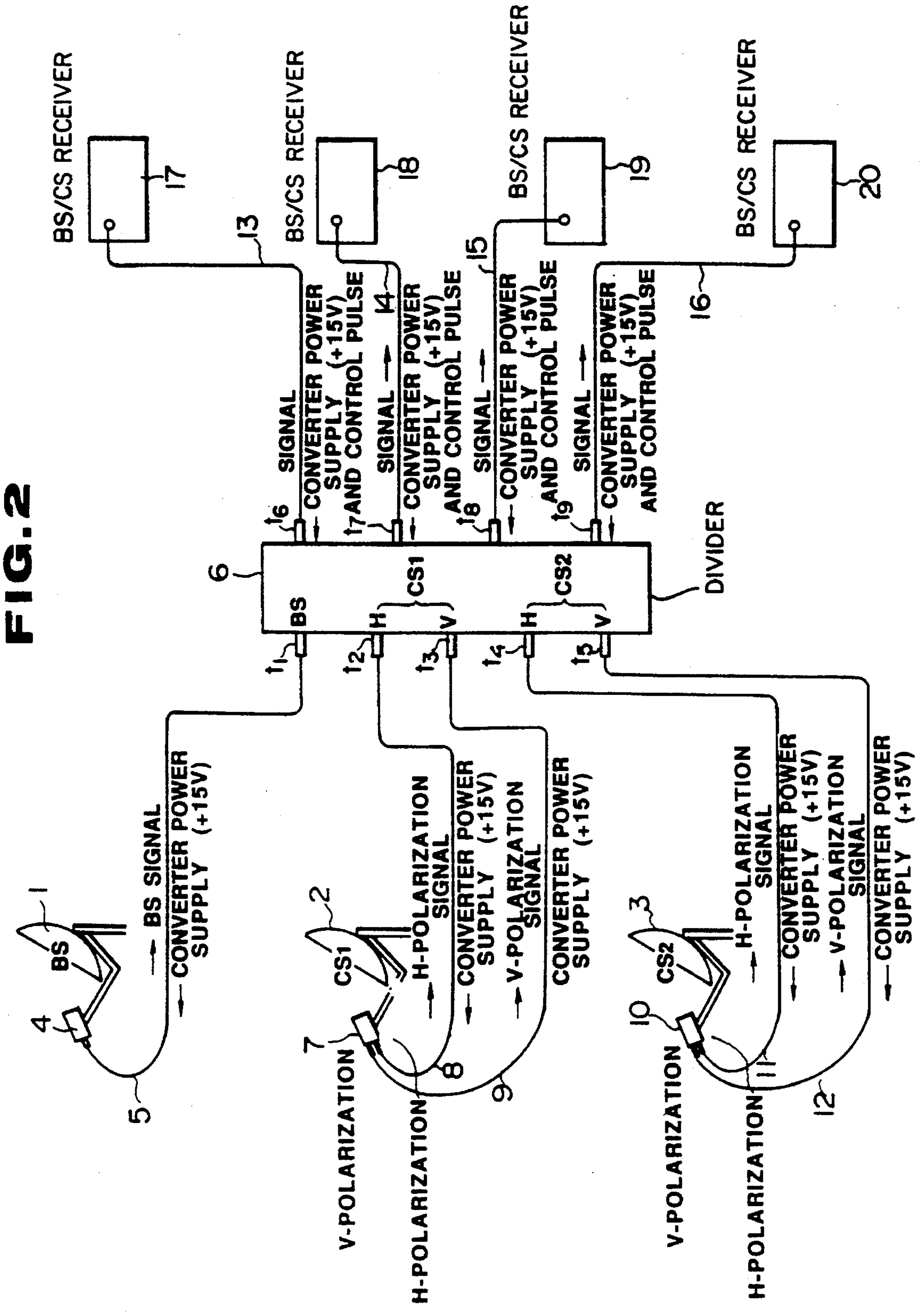
FIG. 2 is a view similar to FIG. 1, showing a satellite broadcast receiving system (first preferred embodiment)

FIG. 1 shows a circuit block diagram of the change-over divider 6. The change-over divider 6 is provided with first to fourth change-over switches $SW_1$–$SW_4$ corresponding to the number of the input/output terminals $t_6$–$t_9$, each of the change-over switches $SW_1$–$SW_4$ receiving all the five input broadcast signals. The change-over switches $SW_1$–$SW_4$ select respective ones of the five broadcast signals in response to respective change-over control signals. The selected broadcast signals are provided to respective ones of the input/output terminals $t_6$–$t_9$ via respective diodes $D_1$ and control pulse trap circuits 21.

The input/output terminals $t_{6-t9}$ are connected via respective coils L and diodes $D_2$ to a regulator 22 which provides constant voltage to a control pulse detection circuit 23 and a microcomputer 24. Additionally, the input/output terminals $t_6$–$t_9$ are connected via the respective coils L to the respective control pulse detection circuits 23 which detect the respective control pulses as transmitted and output the respective detected control pulses to the microcomputer 24.

The microcomputer 24 decodes the respective control pulses, and outputs respective change-over control signals to the first to fourth change-over switches $SW_1$—$SW_4$ corresponding to the input/output terminals $t_6$–$t_9$ to which the respective selected broadcast signals is supplied in accordance with the respective change-over control signals as decoded.

Next, the operation of this embodiment will be described. One of the four BS/CS receivers 17–20, for example, the BS/CS receiver 17, is turned on by the power switch, and selects BS broadcast by the broadcast selecting switch. Then, the converter power supply is outputted via the signal cable 13 while the control pulse is outputted in overlap with this. Since the control pulse is a digital signal, it is hardly affected by voltage fluctuation, resulting in sure transmission.

The regulator 22 receives the converter power supply, and provides power supply to the control pulse detection circuit 23 and the microcomputer 24. The microcomputer 24 receives the control pulse from the control pulse detection circuit 28, and it decodes this control pulse and outputs the change-over control signal to the first change-over switch $SW_1$.

The first change-over switch $SW_1$ selects a BS broadcast terminal. Converter power supply is provided from the first change-over switch $SW_1$ to the BS converter 4 via the signal cable 5. By this, the BS converter 4 is driven to output the BS broadcast signal. This BS broadcast signal as outputted is led to the change-over divider 6 via the signal cable 5 so as to reach the first input/output terminal $t_6$ via the first change-over switch $SW_1$. Then, it is outputted to the BS/CS receiver 17 via the signal cable 13.

In this situation, when the other BS/CS receivers 18–20 are also turned on and select a desired supply respective control pulses, the second to fourth change-over switches $SW_2$–$SW_4$ select respective desired broadcast signal terminals, accordingly. Converter power supplies are provided to the $CS_1$ converters 7 and $CS_2$ converters 10 as selected, which are thus driven to output desired broadcast signals to the BS/CS receivers 18-20. Accordingly, disposing a single signal cable 13-16 to connect each of the BS/CS receivers 17-20 to the change-over divider 6 is sufficient to separately receive a desired broadcast.

Figure 3:
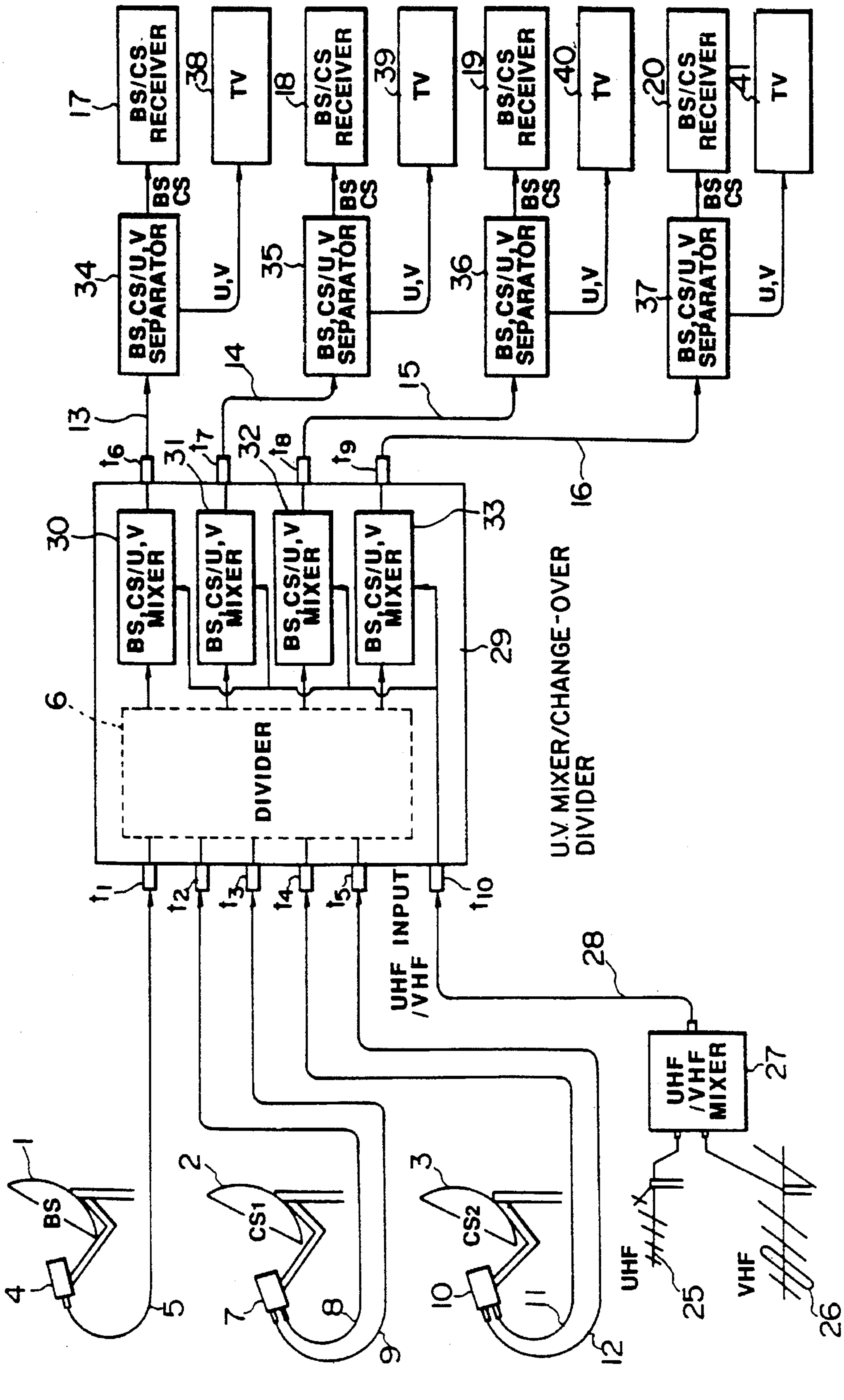
FIG. 3 is a view similar to FIG. 2, showing a broadcast receiving system (second preferred embodiment).

Referring to FIG. 3, a second preferred embodiment of the present invention will be described. The second preferred embodiment is constructed to be a system capable of receiving Ultra High Frequency (UHF) broadcast and Very High Frequency (VHF) in addition to satellite broadcast. FIG. 3 shows a circuit block diagram of a broadcast-receiving system.

Outputs of a UHF antenna 25 and a VHF antenna 26 are inputted to a UHF/VHF mixer 27 in which a UHF broadcast signal and a VHF broadcast signal are mixed together. Output of the UHF/VHF mixer 27 is led to a sixth input terminal $t_{10}$ of a U.V. mixer/change-over divider 29 via a signal cable 28.

The U.V. mixer/change-over divider 29 has first to fifth input terminals $t_1$–$t_5$ to which the same broadcast signals as the first preferred embodiment are inputted, and to which the change-over divider 6 having the same architecture as the first preferred embodiment is connected. Outputs of the change-over divider 6 are inputted to the BS,CS/U,V mixers 30–33, respectively, to which the sixth input terminal $t_{10}$ is connected, and in which satellite waves and ground waves are mixed together. Outputs of the mixers 30–33 are led to the first to fourth output terminals $t_6$–$t_9$, respectively.

The output terminals $t_6$–$t_9$ are connected to the signal cables 13–16 at first ends thereof, respectively. The signal cables 13–16 have the other ends connected to BS,CS/U,V separators 34–87, respectively. The separators 34–37 serve to separate satellite waves and ground waves, and output satellite waves to the BS/CS receivers 17–20 and ground waves to televisions (TVs) 38–41, respectively.

In this second preferred embodiment, the BS/CS receivers 17–20 can separately receive not only satellite broadcasts, but TVs 38–41, and UHF and VHF broadcasts.

In the above embodiments, the number of output terminals $t_6$–$t_9$ is four, but it is not limited thereto.

What is claimed is:

1. A change-over divider for selecting at least one of a plurality of input signals, comprising:

a plurality of input terminals respectively receiving said plurality of input signals;

a plurality of selector switches each switch having a plurality of inputs respectively connected to receive said plurality of input signals and each having an output selected from said plurality of inputs;

a plurality of input/output terminals connected respectively to said outputs of said plurality of selector switches and for receiving respective coded control pulses and power supply signals from respective external sources;

control pulse detection means connected to said plurality of input/output terminals for detecting said coded control pulses input through at least one of said plurality of input/output terminals; and a microcomputer connected to said plurality of selector switches and said control pulse detection means, said microcomputer decoding said control pulse and outputting a change-over control signal to one of said plurality of selector switches which corresponds to said one of said plurality of input/output terminals in response to said control pulse as decoded, said one of said plurality of switches independently selecting one of said plurality of input signal in response to said change-over control signal supplied by said microcomputer.

2. A change-over divider as claimed in claim 1, wherein said control pulse detection means further comprises:

control pulse extraction means for separating said said control pulses from said power supply signals supplied therewith through said corresponding one of said plurality of input/output terminals.

* * * * *

UNITED STATES PATENT AND TRADEMARK OFFICE

CERTIFICATE OF CORRECTION

PATENT NO. : 5,565,805

DATED : October 15, 1996

INVENTOR(S) : Yutaka NAKAGAWA, Tadashi KAJIWARA, Keiji FUKUSAWA and Keiji YUZAWA It is certified that error appears in the above-indentified patent and that said Letters Patent is hereby corrected as shown below:

In the Abstract, line 1, delete "is disclosed,"
Same line, after "which" insert --,--

Col.1, line 14, change "broadcast" to --broadcasts--
line 16, change "broadcast" to --broadcasts--
line 17, delete "which is actually in execution"
line 24, change "a" to --the--
line 25, delete "cable"
line 32, change "dispose" to --utilize--
line 33, change "according to" to --,as limited by--
line 56, after "providing" insert --a--

Col.2, line 32, change "a satellite antenna" to --satellite antennas--
line 33, change "8" to --3--
line 44, after "is" insert --composed of--
line 52, after "is" insert --composed of--
line 63, change "13-18 at one" to --13-16 at--
line 64, change "13-18" to --13-16--

Col.3 line 3, change "13-18" to --13-16--
line 9, change "outputted in overlap" to --output together--
line 10, before "converter" insert --the--
line 23, change "$t_{6\text{-}t9}$" to --$t_6$ -$t_9$--
line 42, change "outputted" to --output--
line 43, change "outputted in overlap" to --output together--
line 51, change "28" to --23--

UNITED STATES PATENT AND TRADEMARK OFFICE
CERTIFICATE OF CORRECTION

PATENT NO. : 5,565,805
DATED : October 15, 1996
INVENTOR(S) : Yutaka NAKAGAWA, Tadashi KAJIWARA, Keiji FUKUSAWA and Keiji YUZAWA It is certified that error appears in the above-indentified patent and that said Letters Patent is hereby corrected as shown below:

Col. 3, line 58, delete "as outputted"
line 61, change "outputted" to --output--
line 64, delete "select a desired"
Col. 4, line 13, after "broadcast" delete "-"
line 16, change "inputted" to --input--
line 23, change "inputted" to --input--
same line, change "BS,CS/U,V" to --BS.CS/U.V--
line 27, after "is" insert --also--
line 33, change "BS,CS/U,V" to --BS.CS/U.V--
line 34, change "87" to --37--
line 40, change ", and" to --can receive--

<u>In the claims:</u>
Col.6, line 3, delete "said" second occurrence

Signed and Sealed this

Twenty-eighth Day of October, 1997

Attest:

BRUCE LEHMAN

*Attesting Officer* *Commissioner of Patents and Trademarks*